United States Patent
Hsu et al.

(10) Patent No.: US 9,535,091 B2
(45) Date of Patent: Jan. 3, 2017

(54) PROBE HEAD, PROBE CARD ASSEMBLY USING THE SAME, AND MANUFACTURING METHOD THEREOF

(71) Applicant: TAIWAN SEMICONDUCTOR MANUFACTURING CO., LTD., Hsinchu (TW)

(72) Inventors: Ming-Cheng Hsu, Hsinchu (TW); Wen-Feng Liao, Hsinchu (TW); Wen-Tsai Su, Hsinchu (TW); Yuan-Pin Huang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/658,572

(22) Filed: Mar. 16, 2015

(65) Prior Publication Data
US 2016/0274147 A1    Sep. 22, 2016

(51) Int. Cl.
*G01R 1/067* (2006.01)
*G01R 3/00* (2006.01)
*G01R 31/26* (2014.01)

(52) U.S. Cl.
CPC .............. *G01R 1/067* (2013.01); *G01R 3/00* (2013.01); *G01R 31/2601* (2013.01)

(58) Field of Classification Search
CPC ............. G01R 1/07342; G01R 1/06711; G01R 1/07378; G01R 1/07314; G01R 1/06738; G01R 1/06772; G01R 31/2886; G01R 31/2889
USPC .......................... 324/756.03, 754.01, 754.03, 324/754.07–754.11, 754.13, 754.14, 324/757.03, 755.01, 755.11, 756.01
See application file for complete search history.

(56) References Cited

U.S. PATENT DOCUMENTS

| | | | | |
|---|---|---|---|---|
| 5,534,784 A * | 7/1996 | Lum | ................. | G01R 1/07378 324/754.03 |
| 6,297,657 B1 * | 10/2001 | Thiessen | ............ | G01R 1/07371 324/754.13 |
| 7,400,156 B2 * | 7/2008 | Wu | ..................... | G01R 1/07357 324/750.21 |
| 8,933,719 B2 * | 1/2015 | Huang | ............... | G01R 1/07342 257/48 |
| 2005/0110510 A1 * | 5/2005 | Brandorff | .......... | G01R 31/2887 324/750.25 |

(Continued)

FOREIGN PATENT DOCUMENTS

TW    200820363 A    5/2008
TW    200944801 A    11/2009

OTHER PUBLICATIONS

Form Factor Inc. (http://www.formfactor.com/our-technology-products/parametric/), Mar. 13, 2015.

*Primary Examiner* — Son Le
*Assistant Examiner* — Thang Le
(74) *Attorney, Agent, or Firm* — Maschoff Brennan

(57) ABSTRACT

A probe head includes a first substrate, a second substrate, a spacer, at least one probe, and an insulating material. The first substrate has at least one first through hole. The second substrate has at least one second through hole. The spacer is disposed between the first substrate and the second substrate. The spacer, the first substrate, and the second substrate together form a cavity. The probe is disposed in the cavity and protrudes from the first through hole and the second through hole. The insulating material is on the probe and at least partially disposed in the first through hole.

20 Claims, 9 Drawing Sheets

(56) References Cited

U.S. PATENT DOCUMENTS

| | | | |
|---|---|---|---|
| 2008/0054919 A1* | 3/2008 | Wu | G01R 1/07371 324/756.04 |
| 2010/0231249 A1* | 9/2010 | Dang | G01R 1/0675 324/754.18 |
| 2011/0048766 A1* | 3/2011 | Kikuchi | C08G 73/1035 174/110 SR |
| 2011/0091999 A1* | 4/2011 | Mizoguchi | G01R 1/07378 438/15 |
| 2012/0025859 A1* | 2/2012 | Huang | G01R 1/07342 324/755.01 |
| 2012/0142144 A1 | 6/2012 | Taheri | |
| 2012/0319711 A1* | 12/2012 | Hung | G01R 1/07371 324/750.16 |
| 2014/0062519 A1* | 3/2014 | Ding | G01R 1/07357 324/755.06 |

* cited by examiner

PROBE HEAD, PROBE CARD ASSEMBLY USING THE SAME, AND MANUFACTURING METHOD THEREOF

BACKGROUND

Semiconductor devices are used in countless applications throughout the world and millions upon millions of individual semiconductor devices are produced annually. Semiconductor devices are individually and completely electrically tested before they are installed within electronic or other devices. Different semiconductor devices perform different functions and therefore undergo different functional, parametric and electrical tests. In any semiconductor device fabrication or testing facility, the number of different semiconductor devices to be tested far exceeds the number of test equipment available to test the devices. As such, different semiconductor devices are tested on the same test assembly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
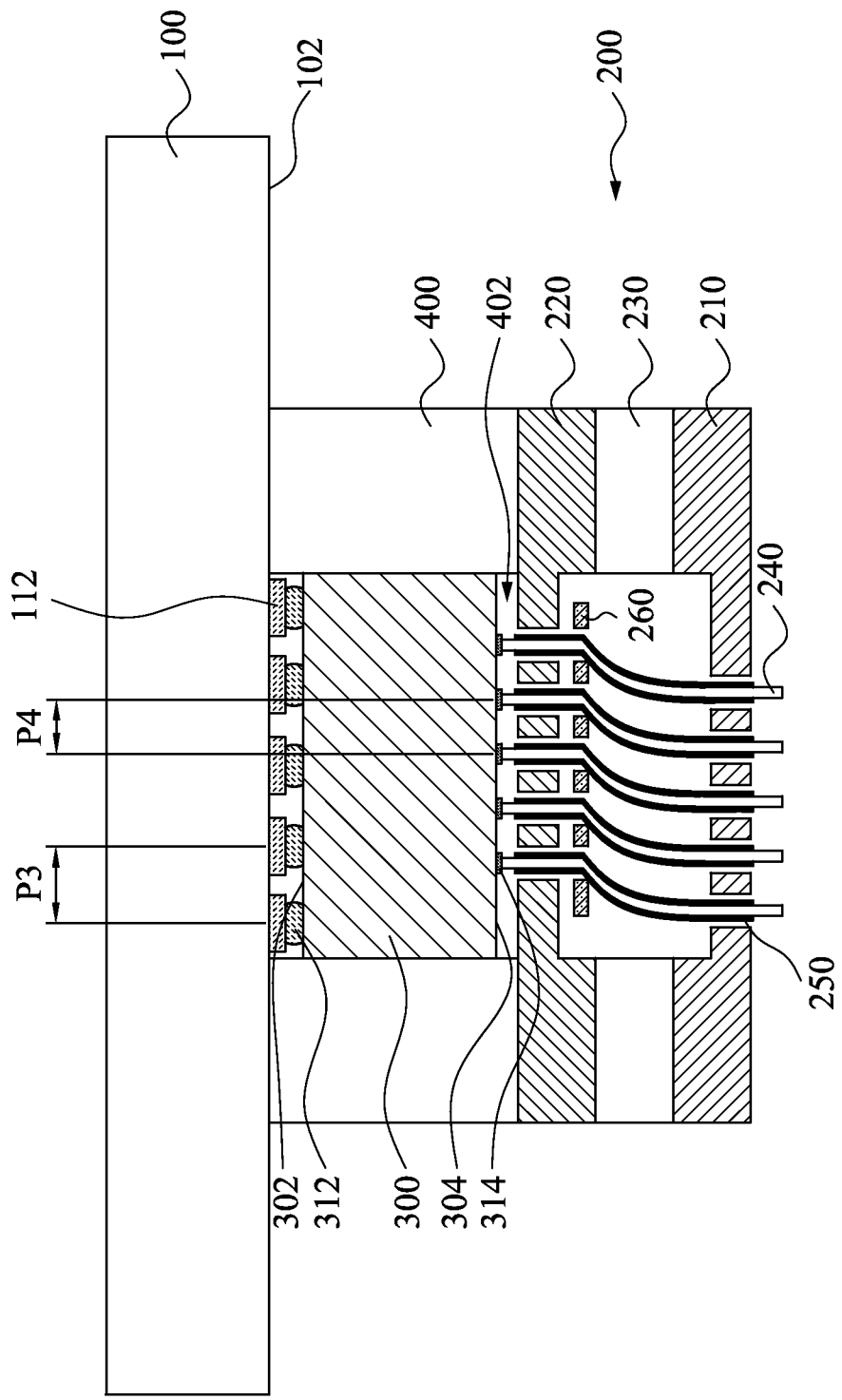
FIG. 1 is a cross-sectional view of a probe card assembly in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
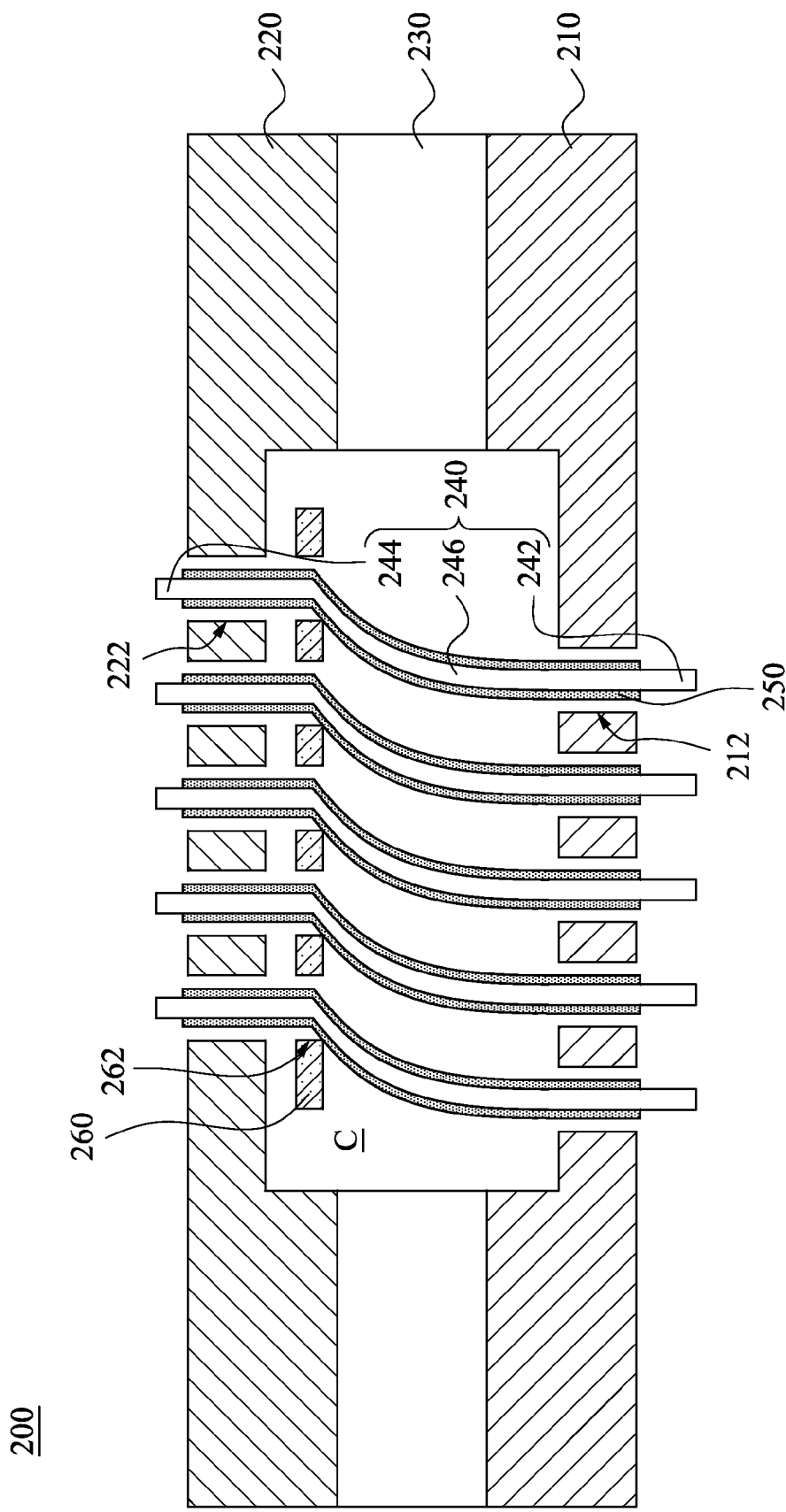
FIG. 2 is a cross-sectional view of a probe head of FIG. 1.

FIG. 1 is a cross-sectional view of a probe card assembly in accordance with various embodiments of the present disclosure, and FIG. 2 is a cross-sectional view of a probe head 200 of FIG. 1. The probe card assembly includes a circuit board 100, a probe head 200, and a space transformer 300. The probe head 200 includes a first substrate 210, a second substrate 220, a spacer 230, at least one probe 240, and an insulating material 250. The first substrate 210 has at least one first through hole 212. The second substrate 220 has at least one second through hole 222. The spacer 230 is disposed between the first substrate 210 and the second substrate 220. The spacer 230, the first substrate 210, and the second substrate 220 together define a cavity C. The probe 240 is disposed in the cavity C and protrudes (or extends) from the first through hole 212 and the second through hole 222. The insulating material 250 is disposed on the probe 240 and at least partially disposed in the first through hole 212. In other words, the insulating material 250 at least covers a portion of the probe 240 disposed in the first through hole 212. The space transformer 300 is disposed between the circuit board 100 and the probe head 200 to electrically interconnect the probe 240 and the circuit board 100.

In some embodiments, the first through hole 212, the second through hole 222, the probe 240, and the insulating material 250 can be plural. Taking FIG. 2 as an example, there are five first through holes 212, five second through holes 222, five probe 240, and five insulating materials 250, respectively. The probes 240 respectively protrude from the corresponding first through holes 212 and the corresponding second through holes 222, and the insulating materials 250 are respectively disposed between the probes 240 and the first substrate 210. In other embodiments, however, the amounts of the first through holes 212, the second through holes 222, the probes 240, and the insulating materials 250 depend on actual situations, and are not limited in this respect.

Reference is made to FIG. 1. When testing takes place, probe head 200 is coupled to the space transformer 300, which, in turn, is coupled to the circuit board 100. The circuit board 100 includes a pattern of contacts 112 on the surface 102 facing the space transformer 300. These contacts 112 cooperate with and are coupled to corresponding contacts 312, such as solder balls or other suitable materials, formed on the surface 302 of the space transformer 300 facing the circuit board 100. Internal leads or signal traces within the space transformer 300 enable the pattern of contacts 312 formed on the surface 302 of space transformer 300 to be different from the pattern of contacts 314 formed on opposed surface 304 of the space transformer 300. The contacts 314 contact the corresponding probes 240.

Reference is made to FIG. 2. Since the insulating materials 250 are respectively disposed in the first through holes 212, i.e., the insulating materials 250 separate the probes 240 and the first substrate 210, the insulating materials 250 can prevent the current passing through the probes 240 from leaking to the first substrate 210, which may cause signal crosstalks among the probes 240. Hence, the testing reliability of the probe card assembly can be improved.

In FIG. 2, the insulating materials 250 are further disposed in the second through holes 222. In other words, the insulating materials 250 further cover portions of the probes 240 disposed in the second through holes 222. In greater detail, the probes 240 can be Cobra probes or other suitable probes. At least one of the probes 240 has a testing terminal 242, a connecting terminal 244, and a body portion 246. The testing terminal 242 and the connecting terminal 244 are opposite to each other, and the body portion 246 is disposed between and interconnects the testing terminal 242 and the connecting terminal 244. The testing terminal 242 emerges from the first through hole 212 and is configured to touch a testing pad of a wafer or a die. The connecting terminal 244 emerges from the second through hole 222 and connects to one of the contacts 314 of the space transformer 300 (see FIG. 1). The insulating material 250 covers the body portion 246 of the probe 240 and exposes the testing terminal 242 and the connecting terminal 244. Since the insulating material 250 is further disposed in the second through hole 222, i.e., the insulating material 250 separates the probe 240 and the second substrate 220, the insulating material 250 can prevent the current passing through the probe 240 from leaking to the second substrate 220, which may cause signal crosstalks among the probes 240. Hence, the testing reliability of the probe card assembly can be further improved.

In FIG. 2, the insulating materials 250 respectively surround the probes 240, and the insulating materials 250 attach to the probes 240. The insulating materials 250 may be coated on the probes 240, and the claimed scope is not limited in this respect. Basically, embodiments fall within the claimed scope of the disclosure if the insulating material 250 is disposed on the probe 240 and at least disposed in the first through hole 212 and/or at least disposed in the second through hole 222.

In some embodiments, the probe head 200 further includes a probe support 260 for supporting and separating the probes 240. The probe support 260 has a plurality of through holes 262 that allow the probes 240 to pass therethrough, such that the spaces among the probes 240 are determined by the probe support 260. The probe support 260 can be made of a nonconductive material such as polyamide mylar, and the claimed scope is not limited in this respect.

In some embodiments, the first substrate 210 and the second substrate 220 can be made of ceramic materials, and the spacer 230 can be made of metal, such as aluminum or other suitable materials, and the claimed scope is not limited in this respect.

Figure 3:
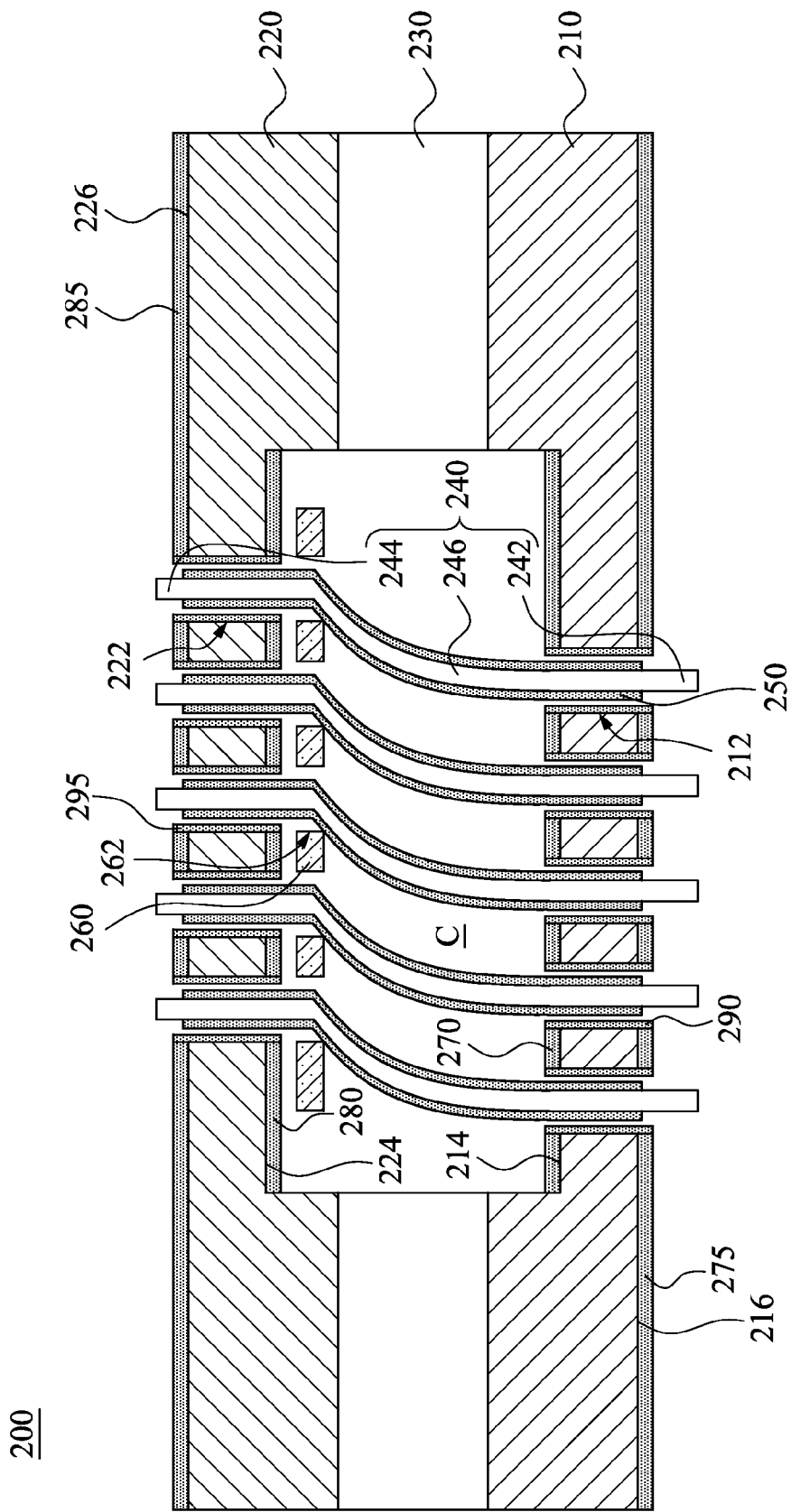
FIG. 3 is a cross-sectional view of a probe head in accordance with various embodiments of the present disclosure.

FIG. 3 is a cross-sectional view of a probe head 200 in accordance with various embodiments of the present disclosure. The difference between the probe heads 200 in FIGS. 2 and 3 pertains to insulating layers 270, 275, 280, 285, 290, and 295 in FIG. 3. In FIG. 3, the insulating layer 270 is disposed at a side 214 of the first substrate 210 facing the spacer 230. The insulating layer 270 may be coated on the side 214 to prevent the current passing through the probe 240 from leaking to the first substrate 210 through the side 214. The insulating layer 275 is disposed at a side 216 of the first substrate 210 opposite to the spacer 230. The insulating layer 275 may be coated on the side 216 to prevent the current passing through the probe 240 from leaking to the first substrate 210 through the side 216. Furthermore, the insulating layer 280 is disposed at a side 224 of the second substrate 220 facing the spacer 230. The insulating layer 280 may be coated on the side 224 to prevent the current passing through the probe 240 from leaking to the second substrate 220 through the side 224. The insulating layer 285 is disposed at a side 226 of the second substrate 220 opposite to the spacer 230. The insulating layer 285 may be coated on the side 226 to prevent the current passing through the probe 240 from leaking to the second substrate 220 through the side 226.

Moreover, the insulating layers 290 are respectively disposed in the first through holes 212. The insulating layers 290 may be coated on the sidewalls of the first through holes 212 to prevent the current passing through the probe 240 from leaking to the first substrate 210 through the first through holes 212. The insulating layers 295 are respectively disposed in the second through holes 222. The insulating layers 295 may be coated on the sidewalls of the second through holes 222 to prevent the current passing through the probe 240 from leaking to the second substrate 220 through the second through holes 222.

Although in FIG. 3, the probe head 200 includes all of the insulating layers 270, 275, 280, 285, 290, and 295, the claimed scope is not limited in this respect. In some embodiments, the probe head 200 may include the insulating layers 270, 275, 280, 285, 290, 295, or combinations thereof. Other features of the probe head 200 in FIG. 3 are similar to those of the probe head 200 shown in FIG. 2, and therefore, a description in this regard will not be provided hereinafter.

In some embodiments, the insulating material 250, the insulating layers 270, 275, 280, 285, 290, and 295 can be made of high volume resistivity materials, such as polyamide-imides. The term "high volume resistivity material" herein represents a material whose volume resistivity is substantially greater than 2*E17 (ohm-cm).

Figure 4A:
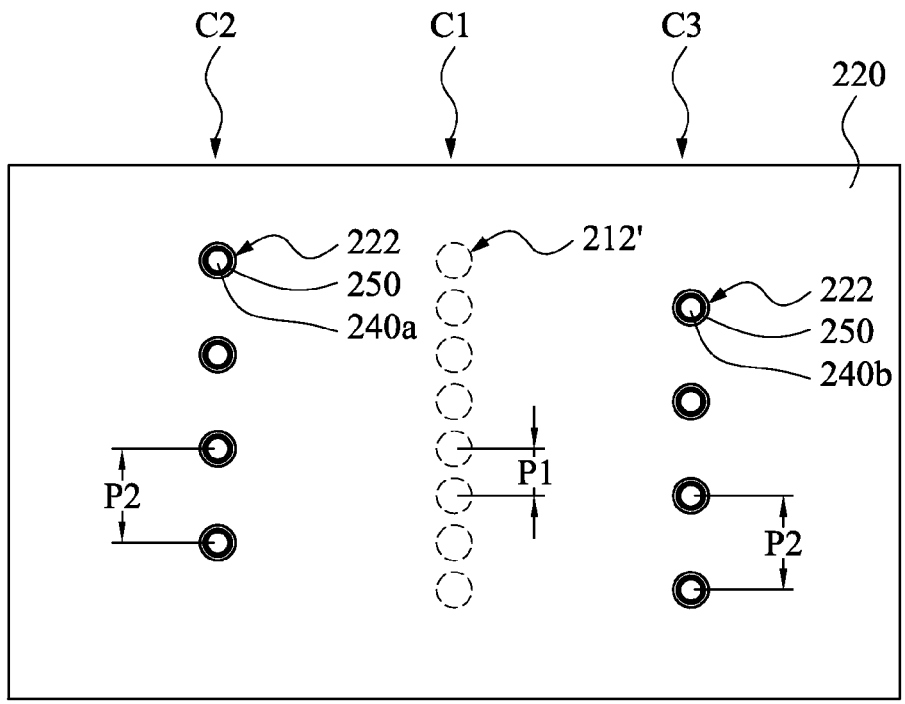
FIG. 4A is a top view of a probe head in accordance with various embodiments of the present disclosure.
Figure 4B:
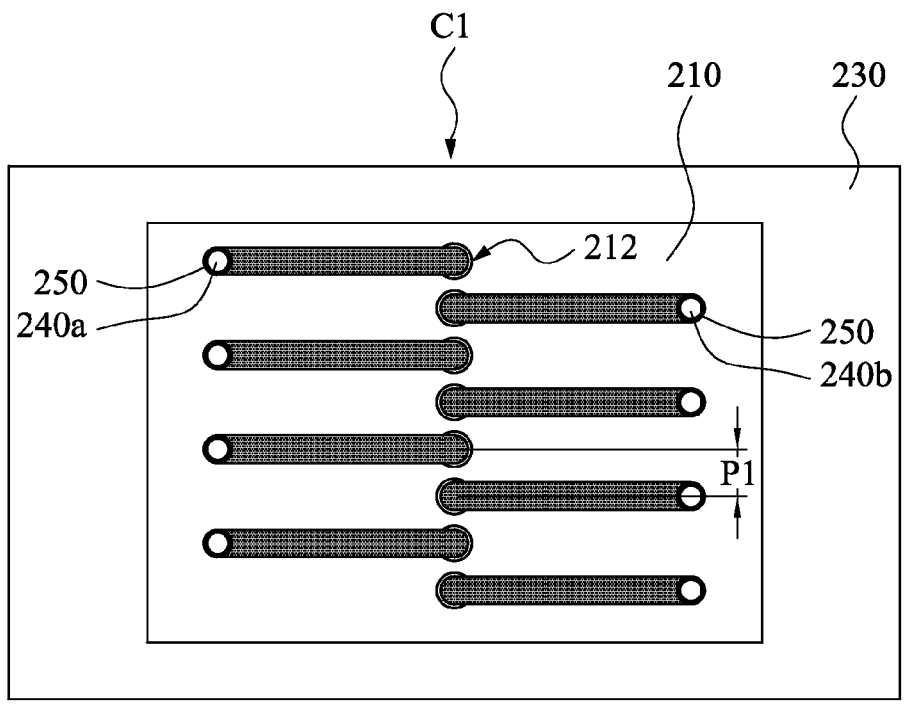
FIG. 4B is a top view of the spacer, probes, and the first substrate of the probe head in FIG. 4A.
Figure 4C:
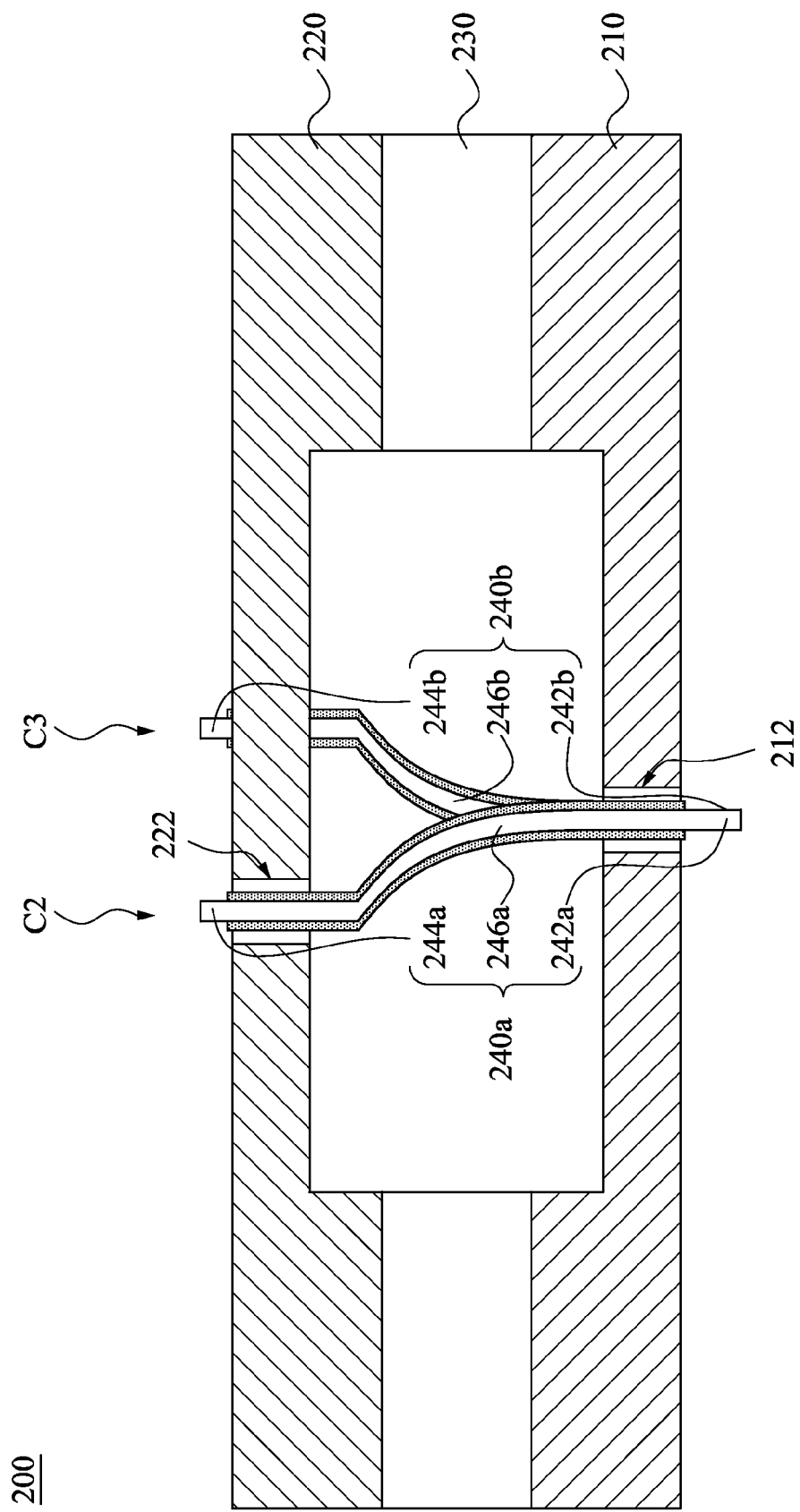
FIG. 4C is a cross-sectional view of the probe head of FIG. 4A.

FIG. 4A is a top view of a probe head 200 in accordance with various embodiments of the present disclosure, FIG. 4B is a top view of the spacer 230, probes 240a and 240b, and the first substrate 210 of the probe head 200 in FIG. 4A, and FIG. 4C is a cross-sectional view of the probe head 200 of FIG. 4A. For clarity, the probe support 260 of FIG. 2 is omitted in FIGS. 4A-4C. In FIGS. 4A and 4B, the first through holes 212 are arranged along one column C1, and the second through holes 222 are arranged along two columns C2 and C3. A projection 212' of the first through holes 212 on the second substrate 220 are disposed between the two columns C2 and C3 of the second through holes 222.

Reference is made to FIGS. 4A-4C. In greater detail, the testing terminal 242a of the probe 240a protrudes from the first through hole 212, and the connecting terminal 244a of the probe 240a protrudes from the second through hole 222 in the column C2. On the other hand, the testing terminal 242b of the probe 240b protrudes from another first through hole 212, and the connecting terminal 244b of the probe 240b protrudes from the second through hole 222 in the column C3. The probes 240a and 240b are alternately arranged. This arrangement reduces the contact areas between the adjacent two probes 240a and 240b, such that crosstalks among the probes 240a and 240b can be further reduced.

Reference is made to FIGS. 4A and 4B. In some embodiments, a pitch P1 of adjacent two of the first through holes 212 is shorter than a pitch P2 of adjacent two of the second through holes 222. For example, the pitch P2 is substantially twice the distance of the pitch P1. If the pitch P1 is about 100 nm, the pitch P2 can be about 200 nm. This means the space between the two adjacent probes 240a (or 240b) can be twice extended while keeping the same pitch at the testing end of the probe head 200. Also, the current leakage (i.e., the crosstalks) among the probes 240a and 240b can be further reduced.

Reference is made back to FIG. 1. In FIG. 1, the circuit board 100 can be a printed circuit board, and may be designed such that different circuit boards 100 dedicated to testing difference semiconductor devices, including substantially the same pattern of contacts 112.

The space transformer 300 may be a multi-layered organic (MLO) or multi-layered ceramic (MLC) interconnect substrate in some embodiments. The contacts 312 of the space transformer 300 can be arranged in an array manner and are configured for mating with the corresponding contacts 112 of the circuit board 100. The contacts 314 of the space transformer 300 can also be arranged in an array manner and are configured for engaging and mating with the connecting terminals 244 (see FIG. 2) of the probes 240. The contacts 312 may have a pitch P3 defined therebetween, and the contacts 314 may have a pitch P4 defined therebetween. The pitch P4 is shorter than the pitch P3. For example, the pitch P3 can be about 1 mm, and the pitch P4 can be about 100 μm.

In some embodiments, the probe card assembly further includes a jig 400 configured to connect the space transformer 300 to the circuit board 100. For example, the jig 400 has an opening 402. The space transformer 300 is disposed and fixed in the opening 402 using, for example, screws (not shown) or other suitable fixing elements. The jig 400 and the space transformer 300 are then attached to the circuit board 100 together using, for example, screws (not shown) or other suitable fixing elements. Hence, the contacts 312 of the space transformer 300 are connected to the contacts 112 of the circuit board 100. Substantially, the probe head 200 is attached to the jig 400, such that the connecting terminals 244 (see FIG. 2) of the probes 240 are respectively connected to the contacts 314 of the space transformer 300. Since the probe card assembly of FIG. 1 is easy to assemble, the manufacturing time and repairing time thereof can be improved.

Figure 5A:
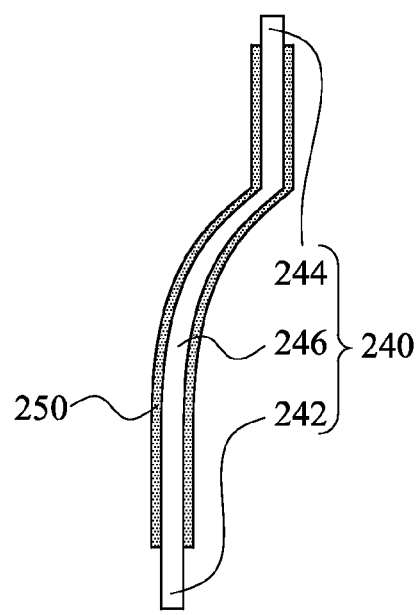
FIGS. 5A-5E are cross-sectional views for manufacturing the probe head in accordance with various embodiments of the present disclosure.

A method for manufacturing a probe head 200 according to various embodiments of the present disclosure, to produce a probe head 200 having the insulating materials 250, will now be described with reference to fabrication sequence shown FIGS. 5A-5E. FIGS. 5A-5E are cross-sectional views for manufacturing the probe head 200 in accordance with various embodiments of the present disclosure. Reference is made to FIG. 5A. An insulating material 250 is formed around a probe 240. The probe 240, may be a Cobra probe or other suitable probe, has a testing terminal 242, a connecting terminal 244, and a body portion 246. The testing terminal 242 and the connecting terminal 244 are opposite to each other, and the body portion 246 is disposed between and interconnects the testing terminal 242 and the connecting terminal 244. The insulating material 250 may be coated on the body portion 246 of the probe 240 and expose the testing terminal 242 and the connecting terminal 244. In other words, the insulating material 250 is attached to and surrounds the probe 240. The insulating material 250 may be made of high volume resistivity materials, such as polyamide-imides.

Figure 5B:
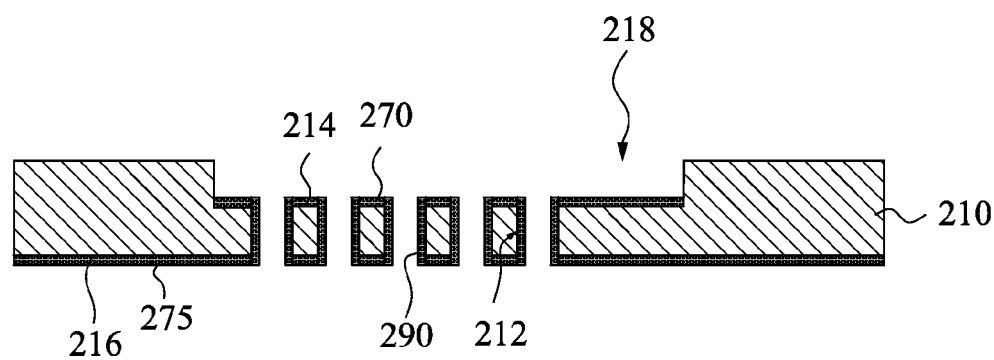

Reference is made to FIG. 5B. A first substrate 210 is provided. The first substrate 210 has at least one first through hole 212 that the probe 240 of FIG. 5A can pass therethrough. For example, the first substrate 210 in FIG. 5B has five first through holes 212, and the claimed scope is not limited in this respect. The first substrate 210 further has a recess 218, and the first through holes 212 are disposed at the bottom of the recess 218. The first substrate 210 can be made of ceramic material or other suitable materials.

In some embodiments, an insulating layer 270 is formed at a side 214 of the first substrate 210. The insulating layer 270 may be disposed in the recess 218 of the first substrate 210. Moreover, an insulating layer 275 is formed at a side 216 of the first substrate 210, and insulating layers 290 are respectively formed in the first through holes 212. The insulating layers 270, 275, and 290 can be made of high volume resistivity materials, such as polyamide-imides. The insulating layers 270 and 275 can be respectively coated on the sides 214 and 216. In other embodiments, the insulating layers 270, 275, and 290 can be omitted, or at least one of the insulating layers 270, 275, and 290 is formed on the first substrate 210.

Figure 5C:
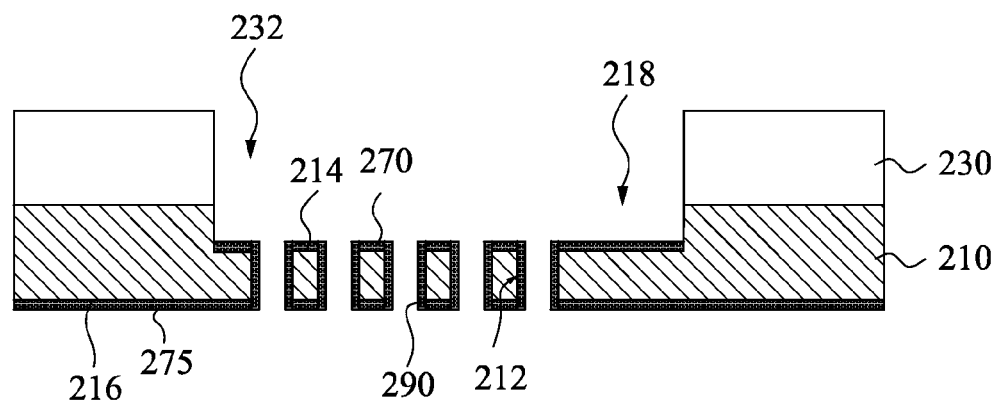

Reference is made to 5C. A spacer 230 is disposed on the first substrate 210. For example, the first substrate 210 can be fixed to the spacer 230 using screws or other suitable fixing elements. The side 214 of the first substrate 210 faces the spacer 230, and the side 216 of the first substrate 210 is opposite to the spacer 230. In FIG. 5C, the spacer 230 has an opening 232. The opening 232 can be aligned to the recess 218 of the first substrate 210 when the spacer 230 is disposed on the first substrate 210. In some embodiments, the spacer 230 is made of metal, such as aluminum or other suitable materials.

Figure 5D:
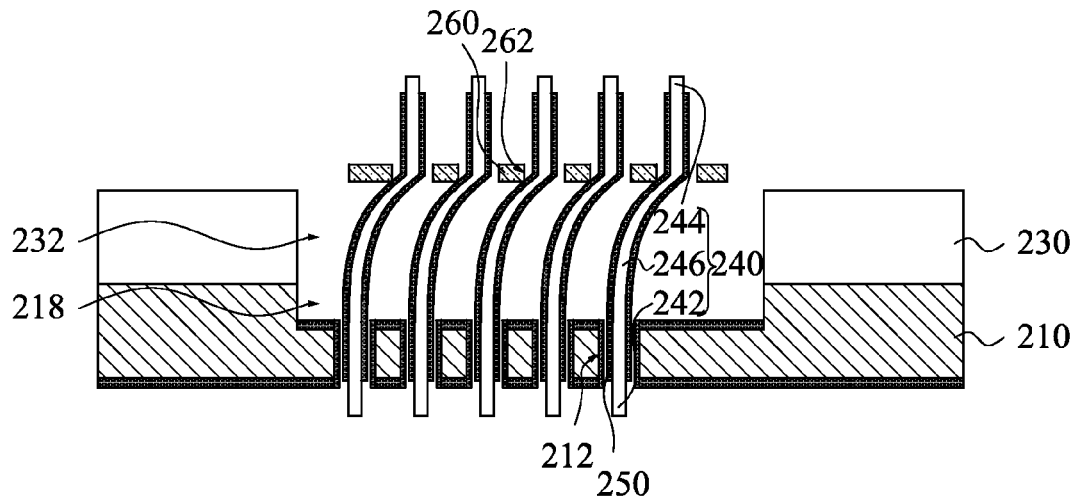

Reference is made to FIG. 5D. The probe 240 is disposed in the opening 232 of the spacer 230. For example, there are five probes 240 disposed in the opening 232 in FIG. 5D. The testing terminals 242 of the probes 240 are protruded from the first through holes 212 of the first substrate 210, such that at least portions of the insulating materials 250 are respectively disposed in the first through holes 212.

In some embodiments, the probes 240 can be supported by a probe support 260. The probe support 260 has a plurality of through holes 262, such that the connecting portions 244 of the probes 240 can respectively protrude from the through holes 262, and the probe support 260 is suspended. In some embodiments, the probe support 260 can be made of a nonconductive material such as polyamide mylar, and the claimed scope is not limited in this respect.

Figure 5E:
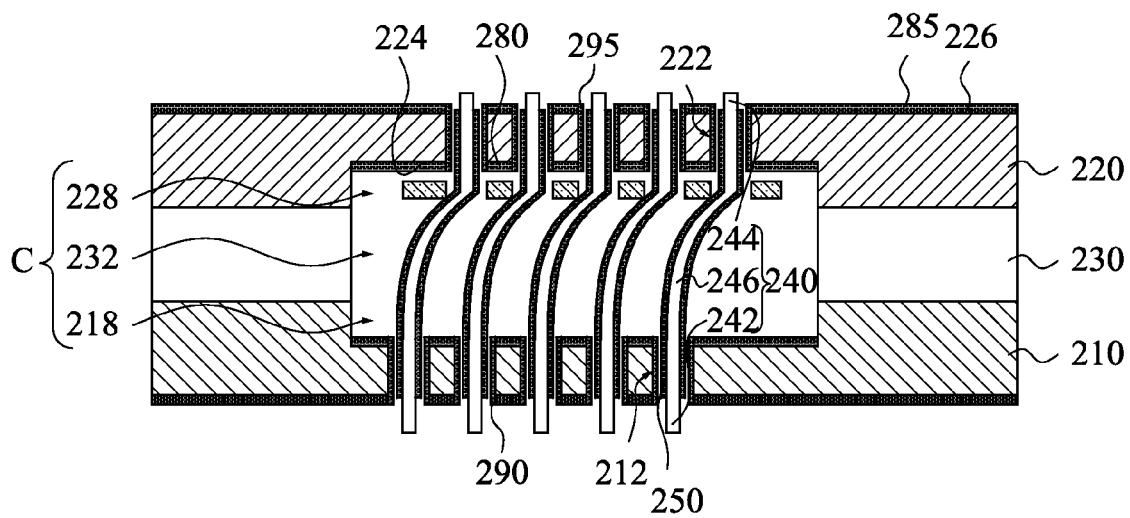

Reference is made to FIG. 5E. A second substrate 220 is provided. The second substrate 220 has at least one second through hole 222. For example, the second substrate 220 in FIG. 5E has five second through holes 222, and the claimed scope is not limited in this respect. The second substrate 220 further has a recess 228, and the second through holes 222 are disposed at the top of the recess 228. The second substrate 220 can be made of ceramic material or other suitable materials.

In some embodiments, an insulating layer 280 is formed at a side 224 of the second substrate 220. The insulating layer 280 may be disposed in the recess 228 of the second substrate 220. Moreover, an insulating layer 285 is formed at a side 226 of the second substrate 220, and insulating layers 295 are respectively formed in the second through holes 222. The insulating layers 280, 285, and 295 can be made of high volume resistivity materials, such as polyamide-imides. The insulating layers 280 and 285 can be respectively coated on the sides 224 and 226. In other embodiments, the insulating layers 280, 285, and 290 can be omitted, or at least one of the insulating layers 280, 285, and 295 is formed on the second substrate 220.

Subsequently, the second substrate 220 is disposed on the spacer 230. For example, the second substrate 220 can be fixed to the spacer 230 using screws or other suitable fixing elements. Alternatively, the first substrate 210, the spacer 230, and the second substrate 220 can be fixed together using one set of fixing elements. The side 224 of the second substrate 220 faces the spacer 230, and the side 226 of the second substrate 220 is opposite to the spacer 230. The recess 218, the opening 232, and the recess 228 together form a cavity C to accommodate the probes 240. Hence, the connecting terminals 244 of the probes 240 respectively protrude from the second through holes 222. In FIG. 5E, the insulating materials 250 are further respectively disposed in the second through holes 222. After the probe head 200 of FIG. 5E is assembled, the probe head 200 can be further assembled to the jig 400 of FIG. 1 to be connected to the circuit board 100 through the space transformer 300.

In FIG. 5E, the insulating materials 250 are respectively partially disposed in the first through holes 212, i.e., the insulating materials 250 separate the probes 240 and the first substrate 210. Moreover, the insulating materials 250 are respectively partially disposed in the second through holes 222, i.e., the insulating materials 250 separate the probes 240 and the second substrate 220. The insulating materials 250 can prevent the current passing through the probes 240 from leaking to the first substrate 210 and/or the second substrate 220, which may cause signal crosstalks among the probes 240. Hence, the testing reliability of the probe card assembly can be improved. Furthermore, the probe 240 can be individually replaced if it is damaged. Hence, the cost of the probe head 200 can be reduced.

Figure 6A:
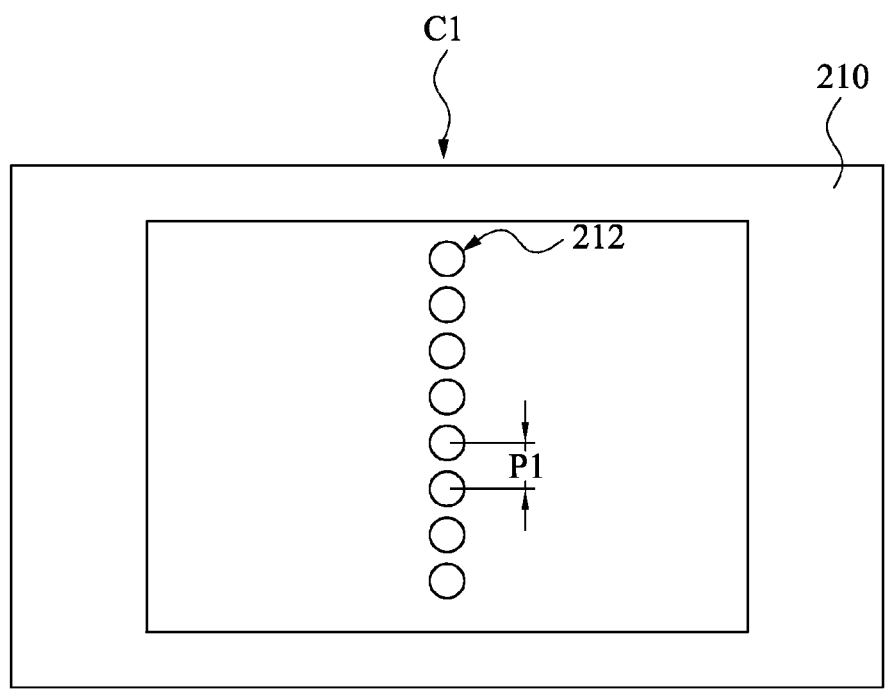
FIGS. 6A-6C are top views for manufacturing the probe head in accordance with various embodiments of the present disclosure.
Figure 6B:
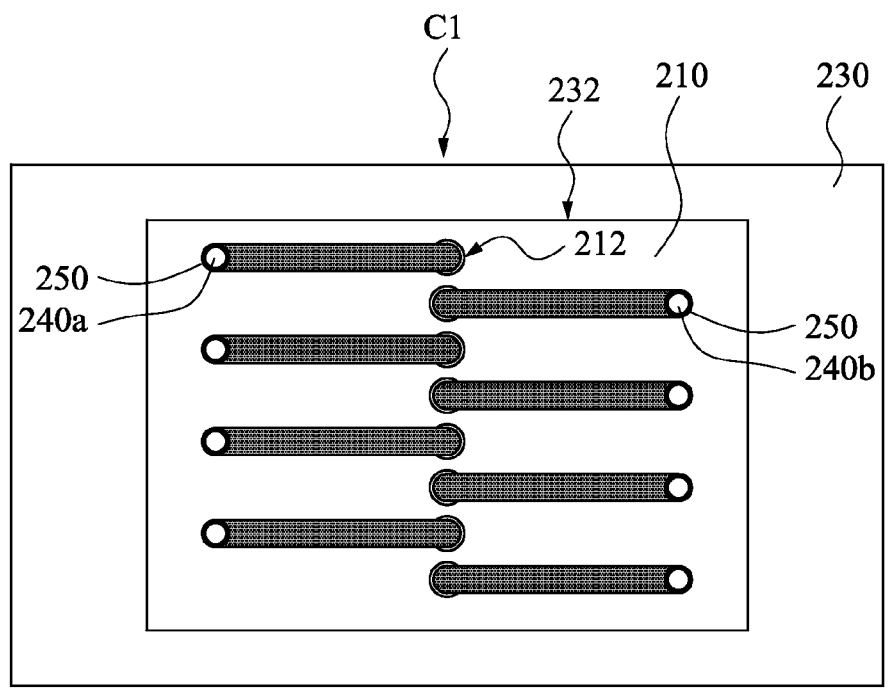
Figure 6C:
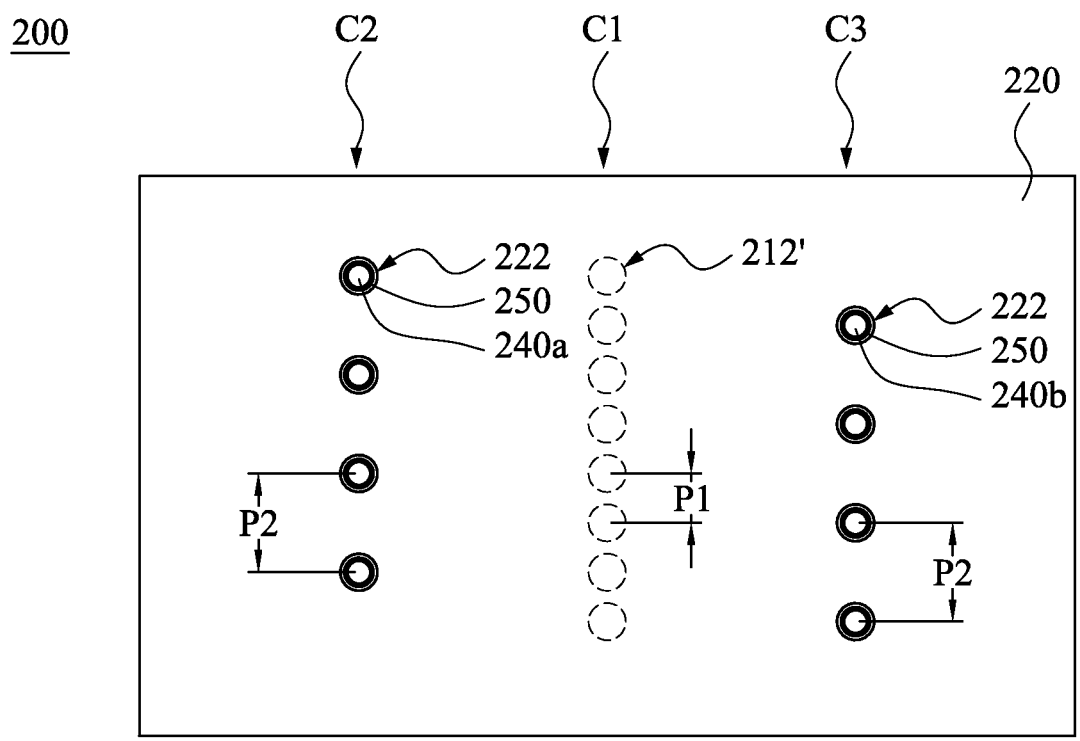

FIGS. 6A-6C are top views for manufacturing the probe head 200 in accordance with various embodiments of the present disclosure. For clarity, the probe support 260 of FIG. 2 is omitted in FIGS. 6B-6C. The manufacturing process of FIG. 5A is performed previously. Since the relevant manufacturing details are all the same as the embodiment in FIG. 5A, and, therefore, a description in this regard will not be repeated hereinafter. Reference is made to FIG. 6A. Subsequently, a first substrate 210 is provided. The first substrate 210 has a plurality of first through holes 212 arranging along one column C1. A pitch P1 is formed between two adjacent first through holes 212. Subsequently, a spacer 230 is disposed on the first substrate 210. Since other features of the first substrate 210 and the spacer 230 of FIG. 6A are similar to the first substrate 210 and the spacer 230 of FIGS. 5B and 5C, a description in this regard will not be repeated hereinafter.

Reference is made to FIG. 6B. Probes 240a and 240b are alternately disposed in the opening 232 of the spacer 230. The testing terminals 242a and 242b (see FIG. 4C) of the probes 240a and 240b respectively protrude from the first through holes 212 as shown in FIG. 4C, and the connecting terminals 244a and 244b (see FIG. 4C) of the probes 240a and 240b are extended towards opposite directions.

Reference is made to FIG. 6C. A second substrate 220 is provided. The second substrate 220 has a plurality of second through holes 222 arranging along two columns C2 and C3. A projection 212' of the first through holes 212 on the second substrate 220 are disposed between the two columns C2 and C3 of the second through holes 222. The connecting terminals 244a (see FIG. 4C) of the probes 240a protrude from the second through holes 222 in the column C2, and the connecting terminals 244b (see FIG. 4C) of the probes 240b protrude from the second through holes 222 in the column C3. This arrangement reduces the contact areas between the adjacent two probes 240a and 240b, such that crosstalks among the probes 240a and 240b can be further reduced. A pitch P2 is formed between two adjacent second through holes 222. The pitch P1 is shorter than the pitch P2. For example, the pitch P2 is substantially twice the distance of the pitch P1. Since the relevant manufacturing details are all the same as in FIGS. 5A-5E, and, therefore, a description in this regard will not be repeated hereinafter.

The electrical properties of the probe card assembly of FIG. 1 were tested to be compared with a commercial probe head assembly, and the data matching (MAT) tests were all passed. These results indicate the probe card assembly of FIG. 1 is reliable as the commercial probe head assembly.

Since the insulating materials are respectively disposed on the probes and at least partially disposed in the first through holes, i.e., the insulating materials separate the probes and the first substrate, the insulating materials can prevent the current passing through the probes from leaking to the first substrate, which may cause signal crosstalks among the probes. Hence, the testing reliability of the probe card assembly can be improved. Moreover, since the insulating materials are further partially disposed in the second through holes, i.e., the insulating materials separate the probes and the second substrate, the insulating materials can prevent the current passing through the probe from leaking to the second substrate, which may cause signal crosstalks among the probes. Hence, the testing reliability of the probe card assembly can be further improved.

An aspect of the present disclosure is to provide a probe head including a first substrate, a second substrate, a spacer, at least one probe, and an insulating material. The first substrate has at least one first through hole. The second substrate has at least one second through hole. The spacer is disposed between the first substrate and the second substrate. The spacer, the first substrate, and the second substrate together form a cavity. The probe is disposed in the cavity and protrudes from the first through hole and the second through hole. The insulating material is on the probe and at least partially disposed in the first through hole.

Another aspect of the present disclosure is to provide a probe card assembly including a circuit board, a probe head, and a space transformer. The probe head includes a first substrate, a second substrate, a spacer, at least one probe, and an insulating material. The first substrate has at least one first through hole. The second substrate has at least one second through hole. The spacer is disposed between the first substrate and the second substrate. The spacer, the first substrate, and the second substrate together define a cavity. The probe is disposed in the cavity and extends from the first through hole and the second through hole. The insulating material at least covers a portion of the probe disposed in the first through hole. The space transformer is disposed between the circuit board and the probe head to electrically interconnect the probe and the circuit board.

Still another aspect of the present disclosure is to provide a method for manufacturing a probe head including forming an insulating material around a probe. A spacer is disposed on a first substrate. The probe is disposed in an opening of the spacer. The probe protrudes from a first through hole of the first substrate, such that at least a portion of the insulating material is disposed in the first through hole. A second substrate is disposed on the spacer, such that the probe further protrudes from a second through hole of the second substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A probe head comprising:
a first substrate having a plurality of first through holes arranged along one column;
a second substrate having a plurality of second through holes arranged along two columns, wherein a projection of the first through holes on the second substrate is disposed between the two columns of the second through holes;
a spacer disposed between the first substrate and the second substrate, wherein the spacer, the first substrate, and the second substrate together form a cavity;
at least one probe disposed in the cavity and protruding from at least one of the first through holes and at least one of the second through holes; and
an insulating material disposed on the probe and at least partially disposed in said at least one of the first through holes.

2. The probe head of claim 1, wherein the insulating material is further at least partially disposed in said at least one of the second through holes.

3. The probe head of claim 1, wherein the probe has a testing terminal and a connecting terminal opposite to each other, and the insulating material exposes the testing terminal and the connecting terminal.

4. The probe head of claim 1, further comprising:
an insulating layer disposed at a side of the first substrate facing the spacer.

5. The probe head of claim 1, further comprising:
an insulating layer disposed at a side of the first substrate opposite to the spacer.

6. The probe head of claim 1, wherein a pitch of adjacent two of the first through holes is shorter than a pitch of adjacent two of the second through holes.

7. The probe head of claim 1, wherein a pitch of adjacent two of the second through holes is substantially twice the distance of a pitch of adjacent two of the first through holes.

8. The probe head of claim 1, wherein the probe has a testing terminal and a connecting terminal opposite to each other, the testing terminal protrudes from said at least one of the first through holes, and the connecting terminal protrudes from said at least one of the second through holes.

9. The probe head of claim 1, wherein the insulating material is made of polyamide-imides.

10. The probe head of claim 1, further comprising:
an insulating layer disposed on at least one sidewall of at least one of the first through holes.

11. The probe head of claim 1, further comprising:
an insulating layer disposed on at least one sidewall of at least one of the second through holes.

12. A probe card assembly comprising:
a circuit board;
a probe head comprising:
a first substrate having a plurality of first through holes arranged along one column;
a second substrate having a plurality of second through holes arranged along two columns, wherein a projection of the first through holes on the second substrate is disposed between the two columns of the second through holes;
a spacer disposed between the first substrate and the second substrate, wherein the spacer, the first substrate, and the second substrate together define a cavity;
at least one probe disposed in the cavity and extending from at least one of the first through holes and at least one of the second through holes; and
an insulating material at least covering a portion of the probe disposed in said at least one of the first through holes; and
a space transformer disposed between the circuit board and the probe head to electrically interconnect the probe and the circuit board.

13. The probe card assembly of claim 12, wherein the insulating material further covers another portion of the probe disposed in said at least one of the second through holes.

14. The probe card assembly of claim 12, further comprising:
a jig configured to connect the space transformer to the circuit board.

15. A method for manufacturing a probe head comprising:
forming an insulating material around a probe;
forming a plurality of first through holes in a first substrate, wherein the first through holes are arranged along one column;
disposing a spacer on the first substrate;
disposing the probe in an opening of the spacer, and the probe protruding from at least one of the first through holes of the first substrate, such that at least a portion of the insulating material is disposed in said at least one of the first through holes;
forming a plurality of second through holes in a second substrate, wherein the second through holes are arranged along two columns; and
disposing the second substrate on the spacer, such that the probe further protrudes from at least one of the second through holes of the second substrate, and a projection of the first through holes on the second substrate is disposed between the two columns of the second through holes.

16. The method of claim 15, further comprising:
disposing another portion of the insulating material in said at least one of the second through holes.

17. The method of claim 15, wherein the insulating material is coated on the probe.

18. The method of claim 15, further comprising:
forming an insulating layer at a side of the first substrate facing the spacer.

19. The method of claim 15, further comprising:
forming an insulating layer at a side of the first substrate opposite to the spacer.

20. The method of claim 15, wherein the insulating material is made of polyimide-imides.

* * * * *